US006560283B1

(12) United States Patent
Fletcher

(10) Patent No.: US 6,560,283 B1
(45) Date of Patent: May 6, 2003

(54) RE-ENCODING DECODED SIGNALS

(75) Inventor: John Andrew Fletcher, Surrey (GB)

(73) Assignee: British Broadcasting Corporation, London (GB)

( * ) Notice: Subject to any disclaimer, the term of this patent is extended or adjusted under 35 U.S.C. 154(b) by 0 days.

(21) Appl. No.: 09/462,945
(22) PCT Filed: Jul. 20, 1998
(86) PCT No.: PCT/GB98/02164
§ 371 (c)(1),
(2), (4) Date: Apr. 25, 2000
(87) PCT Pub. No.: WO99/04572
PCT Pub. Date: Jan. 28, 1999

(30) Foreign Application Priority Data

Jul. 18, 1997 (GB) .............................................. 9715234

(51) Int. Cl.[7] ................................................. H04N 7/12
(52) U.S. Cl. ............................... 375/240.1; 375/240.29
(58) Field of Search ..................... 375/240.29, 240.26, 375/240.25, 240.1, 240.12, 240.02; 348/397.1, 399.1, 425.1, 423.1; 382/234, 235, 251; 386/109, 111

(56) References Cited

U.S. PATENT DOCUMENTS

| 3,571,757 | A | * | 3/1971 | Kiyasu et al. ............... 375/261 |
| 5,237,397 | A | | 8/1993 | Mighdoll et al. ....... 375/240.25 |
| 5,311,549 | A | | 5/1994 | Mahieux ..................... 375/342 |
| 5,533,052 | A | | 7/1996 | Bhaskar ...................... 375/244 |
| 5,648,773 | A | | 7/1997 | Guy ............................. 341/51 |
| 5,677,994 | A | * | 10/1997 | Miyamori et al. .......... 704/501 |
| 5,831,688 | A | * | 11/1998 | Yamada et al. .............. 348/699 |
| 5,838,874 | A | * | 11/1998 | Ng et al. ....................... 386/96 |
| 5,929,916 | A | * | 7/1999 | Legall et al. ........... 375/240.05 |
| 6,023,553 | A | * | 2/2000 | Boyce et al. ................ 386/109 |
| 6,246,438 | B1 | * | 6/2001 | Nishikawa et al. ......... 348/401 |
| 6,304,676 | B1 | * | 10/2001 | Mathews ..................... 382/244 |
| 6,363,176 | B1 | * | 3/2002 | Numata .................... 348/14.13 |

FOREIGN PATENT DOCUMENTS

| EP | 0 509 576 | 10/1992 | ............ H04N/7/12 |
| EP | 0 536 784 | 4/1993 | |
| EP | 0 542 474 | 5/1993 | |
| EP | 0 615 384 | 9/1994 | |
| EP | 0 618 734 | 10/1994 | ............ H04N/7/12 |
| EP | 0 685 971 | 12/1995 | |
| EP | 0 688 123 | 12/1995 | ............ H04L/29/06 |
| GB | 2 251 097 | 6/1992 | |
| JP | 1-158825 | 6/1989 | ............ H03M/7/30 |

OTHER PUBLICATIONS

Pereira et al., "Re–codable Video", ICIP–94, vol. 2, pp. 952–956, Nov. 13–16, 1994.*

* cited by examiner

*Primary Examiner*—Vu Le
(74) *Attorney, Agent, or Firm*—McDermott, Will & Emery

(57) ABSTRACT

If a signal is repeatedly encoded and decoded, coding noise generally accumulates as it passes through the various coding systems. The present system provides means for preventing this, by providing means for identifying, at the second coding system, which coding system was previously used. The second coding can then use the same system as the previous coding. This use of matching coding systems results in very little extra coding noise being introduced by the second coding. The input signal is coded by two different encoders 11 and 12, their outputs are decoded and compared with the input signal at 20 and 21, the differences accumulated at 22 and 23. The smaller of the differences is used by selector 13 to select the encoder which matches the previous coding of the signal. The principles can be extended to MPEG Layer II Audio Coding and similar block coding systems.

26 Claims, 2 Drawing Sheets

RE-ENCODING DECODED SIGNALS

The present invention relates to the re-encoding of decoded signals, particularly analogue or analogue-type signals, and finds particular application to audio signals, but can also be applied to video signals.

Digitisation of analogue signals in signal transmission systems is well established. Digitisation was originally introduced primarily to reduce the effects of noise. However, it is often important to minimize the bandwidth occupied by the signal. Techniques for processing of the digitised signals to reduce the quantity of information to be transmitted have therefore been developed, and can be of considerable complexity. These techniques are generally described as coding systems.

The encoding and decoding of a signal results in a loss of information. Broadly speaking, the greater the bandwidth (bit rate) and the greater the processing power available for the encoding and decoding, the closer the decoded signal is to the original. The difference between the original and decoded signals can be termed coding noise.

Coding systems are designed to minimize the impairment (loss) of perceived quality. For audio compression, for example, the term "psycho-acoustic coding" had been used for high compression coding systems which adapt the signal precision to the human ear's acuity. If the system is well designed, the coding noise will be substantially imperceptible, masked by the desired signal.

A considerable number of techniques for coding audio signals have been developed. In a video signal system in which the video signal is digitised and compressed, there will usually be an accompanying audio signal; this audio signal will need to be digitised, and it may be desirable to compress it as well. Standard techniques for compressing video signals are well known, for example MPEG coding (which itself has several variations or levels).

It is obviously necessary for the audio compression technique to be compatible with the MPEG video compression system. But the MPEG standard includes a considerable variety of audio coding layers and levels. In MPEG-1 and MPEG-2, there are 3 layers, with the coding complexity increasing from payer 1 to layer 3. Also, in MPEG-1, there are 3 possible sampling rates and several modes (mono, stereo, dual mono, etc); in MPEG-2, there are 6 sampling rates and more modes (including multi-channel modes).

Which coding systems are implemented at different signal coding stations depends on the particular circumstances at the different stations. If a particular station is designed to deal with only one or a few specific types of signal, then the specific types of coding (for both video and audio signals) required for those types of signal may be implemented. Often, however, a station may implement a wide range of coding systems, with the particular coding system used being selected according to the requirements of the signal being coded and changed as those requirements change. Thus, there are several basic sets of coding systems which may be applied to a particular signal. In addition, the coding parameters or coding decisions associated with a given signal may change dynamically. Whilst the basic coding scheme can often be specified in such a way that it is applied uniformly at different coders, the dynamic coding decisions may not necessarily be performed in the same way from one coder to another.

It is often necessary to transmit coded signals through a chain of several stages ("hops"). The different stages may have different signal handling characteristics, and/or the coupling between the different stages may be relatively primitive. This may result in the signal having to be decoded as it leaves one stage and re-encoded as it enters the next stage. Similarly, a station may be required to process the signals passing through it, e.g. for mixing or merging. This also in general requires the incoming signals to be decoded before they are processed and re-encoded for onward transmission.

It is well recognized that in general, such decoding and re-encoding results in a loss of quality. As discussed above, the original encoding and decoding introduces coding noise, so the input for the second coding will consist of the original signal plus that coding noise. The second coding will introduce its own coding noise, so the output from the second coding will contain two lots of coding noise, and so on. The coding noise can easily accumulate to the point where it becomes apparent, audible (in the case of audio) or visible (in the case of video), producing a noticeable loss of quality.

The general object of the present invention is to reduce the loss of quality occurring in such cascaded decoding and re-encoding.

The invention has evolved from the recognition that, when the two coding systems are identical, then if the re-encoding uses exactly the same parameters as the original encoding, the second coding system will introduce virtually no coding noise beyond that already introduced by the first coding system.

According to one aspect of the present invention there is provided encoding apparatus for encoding an input signal comprising encoding means for performing a plurality of different encodings, analysing means for analysing the signal to detect characteristics of a previous coding, and selection means for selecting the type of encoding performed according to the results of the analysis.

According to another aspect, the invention provides a method of encoding a signal comprising analysing the signal to detect characteristics of a previous coding and encoding the signal accordingly.

In simple versions of the invention, the input signal may be a true analogue signal. However, the input signal may be a "near-analogue" signal, ie a signal which has been partially decoded but is still in digital form, for example a pulse code modulation (PCM) signal, or an uncompressed digital bitstream.

The component of the signal subject to coding could simply be the signal itself. This would be the case in a companding system such as NICAM. Alternatively the component could be derived from a transform of the original signal. Examples are a time-to-frequency transform of an audio signal or a discrete cosine transform of an image.

The invention can advantageously be applied to the coding of audio signals within the MPEG standards, where a variety of different codings may be used for the audio signal.

The invention may be applied to analyse the incoming signal initially, determine appropriate coding parameters and then re-code the signal for a prolonged period using those parameters. More preferably, the invention is employed to analyse the signal dynamically, that is while coding is in progress and to re-estimate the coding parameters regularly or quasi-continuously. In particular, in the case of re-coding a previously compressed signal (the preferred application) such as a video or audio signal, the coding parameters will change frequently as the signal changes to provide efficient encoding. Therefore, the analysis is preferably performed (quasi-)continuously, preferably to determine a set of coding parameters for each sequential block of data (for example a block of MPEG audio or a video frame of video group of pictures).

It is to be appreciated that it may not always be possible to replicate previous coding exactly, particularly where the signal has been processed in decoded form, but by taking into account, and to some extent following, estimated previous coding decisions, it is found that the amount of coding noise introduced in re-coding is normally less than if re-coding were performed without analysis, and in many cases a significant improvement results.

Other aspects and preferred features are set out in the claims to which reference should be made.

Coding apparatuses embodying the invention, and various modifications and developments thereof, will now be described, by way of example, with reference to the drawings, in which.

It is to be noted in the following specific discussion that, unless otherwise stated, techniques and principles which are described below in the context of a specific application may be applied more generally to other applications. In this specification, references to a previous coding preferably imply a transformation of a signal from one form to another, typically involving compression and/or typically involving at least the potential for data loss, rather than mere formating or packaging of a signal for delivery or transmission.

Basic Principles

Figure 1:
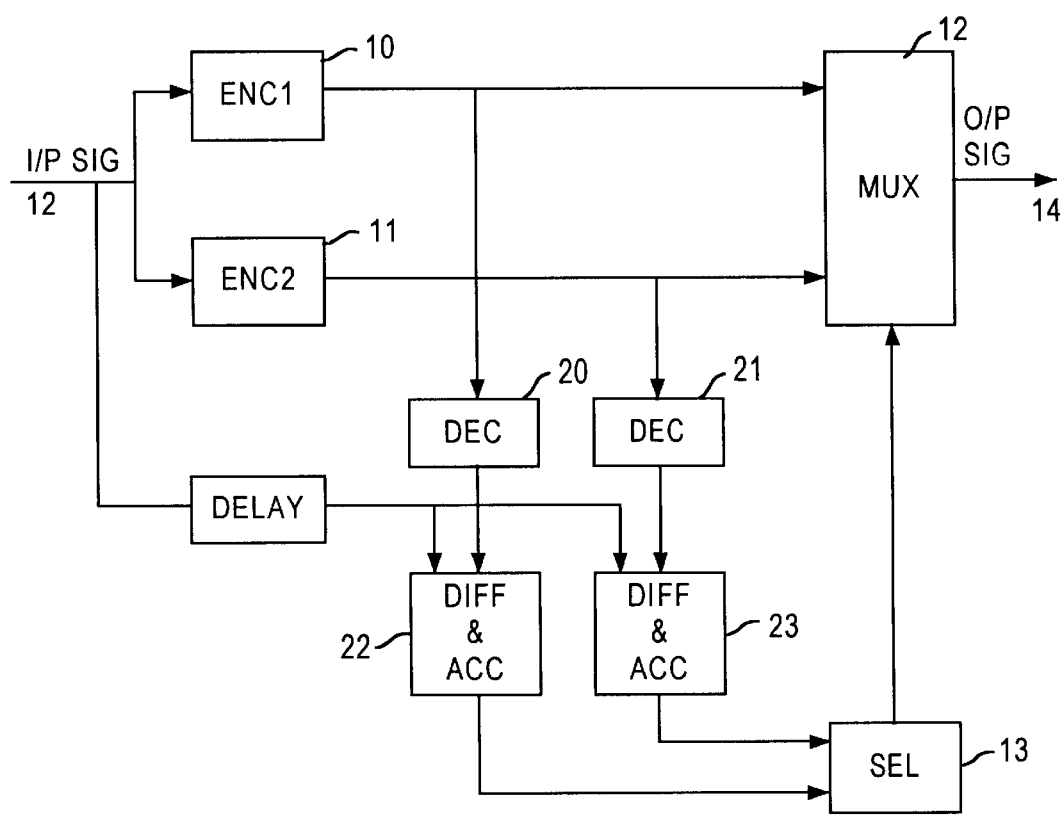
FIG. 1 is a block diagram of a simple encoding apparatus.

Referring to FIG. 1, the encoding apparatus comprises two encoders, ENC1 10 and ENC2 11, which encode an input analogue signal I/P SIG on an input line 12 according to different quantisation schemes. Their outputs are fed to a multiplexer MUX 13 which is controlled by a selector SEL 13 and which produces the final encoded output signal O/P SIG on line 14.

These components form a conventional multiple coding encoder. In the prior art encoder, the selector 13 would typically have been set manually according to which coding characteristics were desired.

In the present apparatus, the encoders 10 and 11 feed, via respective decoders 20 and 21, respective difference monitors 22 and 23, which are also fed with the input analogue signal on line 12. The difference monitor gives an indication of which type of encoder was most likely to have been used in the previous encoding. The outputs of the difference monitors are fed to the selector unit 13, which controls the multiplexer 12 accordingly.

The difference monitors determine confidence values which represent the likelihood of a particular type of encoding having been previously used. In one embodiment, each of the difference monitors 22 and 23 determines the average difference between the input analogue signal on line 12 and the decoded signal from the appropriate one of the decoders 20 and 21. This may be done by determining the difference between the input analogue signal and the encoded and decoded signal fed to it, squaring the difference, and accumulating or integrating the squared difference. Alternatively, the difference monitors may determine the absolute value of the difference before performing the accumulation.

It will be appreciated that the signal, or a component derived therefrom will usually have been previously quantised.

In another embodiment, the confidence values are derived by dividing the quantiser step size by the rms quantisation noise. Of the quantisers tried, the one which gives the highest confidence value is the most likely to have the same parameters as the previous encoding. Since the noise is theoretically zero for the correct choice, an alternative is to divide the rms quantisation noise by the quantiser step size with the result that the lowest values are best.

The difference monitors accumulate the difference value over some convenient period. If the coding systems use sampling techniques (as discussed below), a convenient number of samples may be taken, the sum of the squared differences divided by the number of samples, and the square root taken. This will give an rms quantisation noise value.

If the signal had not previously been quantised with the trial quantiser, then the rms quantisation noise should be roughly of the same order as the quantiser step size. If the signal had previously been quantised with this quantiser, then the rms quantisation noise will be very much lower than the quantiser step size.

Instead of the confidence values described above, other criteria may be used for selecting the quantiser. For example, one criterion is to select the coarsest quantiser which achieves a coding noise below some margin, typically set to be somewhat above the other noise inherent in the system.

In the simplest form, the encoders 10 and 11 encode the input analogue signal to equally spaced quantisation levels. The input signal may be taken as normalized to lie between $-1.0$ and $+1.0$, and the encoders may quantise to say 3 and 5 levels respectively. That is, encoder 10 will encode to the values $-2/3$, 0, and $+2/3$, and encoder 11 will quantise to the values $-4/5$, $-2/5$, 0, $+2/5$, and $+4/5$.

If the input analogue signal is derived from a coded signal which was coded to 3 levels, it will jump between the 3 values $-2/3$, 0, and $+2/3$. When this is encoded by encoder 10 and decoded by decoder 20, it will again have the values $-2/3$, 0, and $+2/3$. The difference between the two signals fed to the difference monitor 22 will therefore always be 0. But when the input signal is encoded by encoder 21, it will be quantised to the values $-4/5$, $-2/5$, 0, $+2/5$, and $+4/5$, and will be decoded to these values by the decoder 21. The difference between the two signals fed to the difference monitor 23 will therefore be the difference between a 3-level quantisation value and a 5-level quantisation value. If the two particular levels are both 0, this difference will be 0; but for any other values of the levels, this difference will be something different from 0.

The difference monitor 22 will therefore produce a 0 output, whereas the difference monitor 23 will produce an output which is well above 0. This indicates that the input analogue signal was derived from a 3-level code. The 0 output from the difference monitor 22 causes the selector unit 13 to control the multiplexer 12 to select the output of the 3-level multiplexer 10 as the output signal on line 12.

In practice, the encoding and decoding through encoder 10 and decoder 20 will not produce a perfect replica of the input analogue signal. There will therefore be slight differences between these two signals, and the difference monitor 22 will not produce an exact 0 signal. The output of this difference monitor will however still be very much smaller than the output of the other difference monitor.

The apparatus can be extended to more than 2 codings, with the appropriate number of encoders, decoders, and difference monitors. The selector circuit 13 will select that encoder whose difference monitor gives the smallest output. It is to be understood that the example above has been described to aid understanding of the invention; in practical implementations, rather than two (or more) discrete encoders, there may be an encoder having configurable encoding parameters (normally in the form of a digital signal processor or computer apparatus) and the parameters will be selected to provide the appropriate encoding.

We have taken the levels for the quantisation as equally spaced (−2/3, 0, and +2/3, or −4/5, −2/5, 0, +2/5, and +4/5). In some coding systems, particularly with more levels, the levels may not be equally spaced; that is, the quantiser step size may not be uniform over the full signal range of −1.0 to +1.0. This will not affect the principles of the present apparatus.

If the input signal has been subjected to more than one coding system, ie if it has been repeatedly encoded and then decoded, then each coding system will normally erase any artifacts or "signature" of any previous coding system. The present apparatus will therefore normally detect the last coding system through which the signal passed.

The two encoders 10 and 11 are shown as distinct and operating in parallel. However, a single encoder can be used if its characteristics can be controlled to vary its encoding parameters, e.g. the number of levels. A single encoder can then be used and stepped through its various numbers of levels, with a single difference monitor generating the difference signals for the various numbers of levels in succession. Each value is stored as it is generated, and the stored values are then compared to determine the coding system of the input analogue signal. The encoder is then set to that system by the selector 13.

The encoders 10 and 11 perform two different functions. They form part of the coding detection path (to the selector 13) which detects what form of coding (if any) has been applied to the input analogue signal; they are also used to encode the analogue input signal to produce the output encoded signal on line 14. It may be desirable to separate these two functions. This will have the disadvantage of duplicating the encoders 10 and 11. However, such separation of functions may have countervailing advantages, as discussed later.

If the input analogue signal has not been derived from a 3-level or 5-level coding then the two confidence values will be approximately equal. The apparatus will then detect that the input signal has not previously been encoded and decoded, or has been decoded from some other coding scheme. In this case, the selector 13 can use some other criterion for selecting between the two encoders 10 and 11. For example, if high quality is desired, then the 5-level encoder will be selected, whereas if a high compression is desired, the 3-level encoder will be selected.

When the apparatus is running, ie the appropriate one of the encoders 10 and 11 has been selected and the output signal on line 11 is being generated from the selected encoder, the selector 13 can be locked to hold the selection until e.g. a change of signal source occurs. Alternatively, the apparatus can monitor the input analogue signal continuously, and switch between different encoders or otherwise reset the apparatus whenever a change of coding of the input analogue signal is detected.

Sampling Rate

We have assumed so far that the coding by the encoders 10 and 11 is substantially continuous. On that assumption, the decoded signals from decoders 20 and 21 will follow the input analogue signal closely. In practice, however, the coding may be at a relatively modest rate. The outputs of the decoders 20 and 21 will then tend to follow the input analogue signal with noticeable delays, depending on the relative timing of the decoding of the coding system from which the input analogue signal was derived and of the encoders 10 and 11. This will tend to increase the outputs of both the difference monitors, and discrimination between their outputs will be made less reliable. This can be overcome by either by delaying the signals fed to the difference monitors, as shown in FIG. 1, or by gating them with the clock signal used for timing the encoders 10 and 11.

With a modest rate of coding, it may also happen that the encoders 10 and 11 sample on the edges of the analogue input signal (assuming that it is derived from a coding system). This will again tend to increase the outputs of both the difference monitors, with reduced reliability of discrimination. To overcome this, two encoders can be provided for each coding system, operating in antiphase. If one of a pair of encoders happens to be timed to operate on or close to the edges of the input analogue signal, the other will automatically be timed to operate when the input analogue signal is steady.

Instead of using doubled encoders, this timing problem can be overcome by using a single encoder (for each coding system), and dithering, cycling, or stepping its timing. For the appropriate encoder, there will be a range of timing for which the output of the difference monitor will be low. Once this range has been located, the timing can be fixed at a point in the middle of the range.

The doubling of encoders, or searching for correct timing of the encoders, effectively synchronizes the encoding with the input analogue signal. Once synchronization has been achieved, it has to be maintained.

If the timing of the encoding is not fixed, then it may be possible to track the timing of the input analogue signal and adjust the timing of the encoding accordingly. This is one situation where the separation of the encodings for input signal coding system detection and output signal generation may be desirable. The detection of the input signal coding, and more specifically its timing, can be performed by using a dither or the like to detect when the timing is becoming critical, and the encoding of the output signal can be adjusted before the timing of the encoder for the output signal becomes critical.

If the timing of the encoding is fixed (e.g. because it has to be synchronized with an MPEG video coding), then the apparatus will need to monitor the input analogue signal continuously, to detect when synchronization is being lost, and e.g. reset the encoder appropriately, as discussed above.

We have assumed so far that the two possible coding systems, 3-level and 5-level, operate at the same fixed sampling rate. It is possible for different coding systems to operate at different sampling rates; for example, there may be 2 possible coding systems (3-level and 5-level) and 2 possible sampling rates. In such a case, 4 encoders would be needed, for the 4 possible combinations (or fewer if the operating parameters of the encoder or encoders can be adjusted).

It can happen that one coding system is a subset of another. An example is when the number of quantisation levels used by a complex coder is a multiple of the number used by a simple coder. If the input analogue signal was coded using the simpler coding system, the difference monitors of both coding systems will give approximately equal low signals. In such a case, the selector 13 is preferably designed to select the simpler of the two coding systems.

In some circumstances there may be some prior knowledge of the type of coding system from which the input signal has been derived. This may occur, for example, if the signal is an audio signal accompanying an MPEG video signal, as different versions of MPEG allow different types of audio coding. In such circumstances, the present apparatus can obviously be constrained to analyze only those types of coding. This may for example involve limiting the number of parameter values through which the apparatus steps, or gating the outputs of the selector 13 so that it has to select a coding system which is of the same type.

Block Coding Systems

The description so far has been broadly in terms of relatively simple coding systems. The application of the present principles to a block coding system will now be discussed. In a block coding system, the signal being coded is divided into blocks, for instance time blocks or portions of an image. The samples in the block may be transformed to some other domain (e.g. from the time to the frequency domain) before being coded. This results in a high compression, ie a low bit rate coding.

In the apparatus described above, we have assumed that the input signal is a true analogue signal. In the case of a simple quantisation, there is only a single step between the encoded signal and the true analogue signal, with the conversion being performed by a digital-to-analogue converter. In more elaborate coding systems such as block coding systems, however, the encoding process from the initial true analogue signal may for example start with an analogue-to-digital conversion which is then followed by further processing of the digitised signal. The simple digitised version of the raw analogue signal is often termed a pcm (pulse code modulated) signal. The decoding follows the reverse course, with the encoded signal being digitally processed to reproduce the simple pcm signal before the final step of digital-to-analogue conversion.

In such systems, the pcm signal (the simple digitised signal) may be available as well as, or instead of, the true analogue signal. The pcm signal may often be used as the input signal in versions of the present apparatus designed to encode into such more elaborate coding systems. This avoids the inefficiency and slight loss of quality involved in decoding from pcm form to true analogue form and encoding back into pcm form.

The present apparatus, as discussed above, has to be synchronized with the input signal. If the input signal has been encoded using a block coding system, the apparatus has to be synchronized with the blocks of the incoming signal. This block alignment information may be available from an auxiliary data signal, e.g. as described in our Patent Application GB 97 01616.6. However, if the block alignment is not known, it may be determined by the repeated application of the process described above. This may be done by repeating the analysis for all possible block alignments, whereby the alignment which gives best confidence values for the deduced parameters is the most likely. Alternatively there may be some sub-block alignments which can be detected by an improvement in confidence values. This would allow an iterative method to be used, as discussed below.

In the case of MPEG Layer II the frame length is 1152 samples but instead of trying all 1152 alignments, one can proceed as follows. First, step the alignment by one sample over a range of 32 samples to find the alignment of 32 sample blocks used in the filterbank. Second, step the alignment in 32 sample units over a range of 384 samples (ie 12 steps) to find the scale factor blocks. Finally step in 384 sample units over 1152 samples (ie 3 steps) to find the frame alignment. Each level of alignment will be indicated by a peak in the confidence values for that set of trials. The total number of trials required is 32+12+3=47.

In practice, the number of quantisation possibilities for a block coding system is likely to be large. The quantiser step size may be a function of more than one variable; in the case of MPEG Layer II Audio, for example, it is a function of the scale factor (defined below) and the number of quantisation levels. In block coding systems, the same quantiser will usually be applied to a set of samples in the block. Each such set of samples is examined to see which of the possible quantisers for the coding system in question is the most likely.

If appropriate, the total number of bits which would be required to encode the block using the deduced parameter values can be calculated. For some coding systems, only certain bit-rates are allowed and there is no sharing of bits between blocks. This means that the number of bits used to encode the block previously would have been just less than or equal to a certain number (dependent on bit-rate). If the number of bits calculated using the deduced parameter values is consistent with this, then this is a further indication that the deduced parameters are correct. If it is not, for example because the number of bits slightly exceeds one of the expected maximum values, then it may be possible to find the correct result by taking a second choice of quantiser for a particular component, or components, which would cause the total bit count requirement to be met.

MPEG Layer II Audio Coding

We will now consider the specific case of MPEG Layer II audio coding. In this, a group of 1152 pcm audio samples is transformed to the frequency domain to give 36 values in each of 32 frequency sub-bands. This forms a "frame" for encoding.

In each sub-band, the 36 samples are divided into 3 groups of 12, known as "scalefactor blocks". Each of these 3 groups has a scalefactor applied to it, such that when the samples in the group are divided by the scalefactor, they will all lie inside the range −1.0 to +1.0. A "bit allocation" is also chosen for the sub-band, corresponding to a number of quantisation levels. The bit allocation in each subband is constant for the frame, ie for the 3 scalefactor blocks. Each sample is divided by its scalefactor and then quantised according to the bit allocation.

The scalefactor is chosen from certain allowed values. The number of quantisation levels is also chosen from certain allowed values, which depend on the sub-band (and also on the audio sampling frequency). For example, in certain cases the numbers of quantisation levels allowed are 1, 3, 5, 7, 9, 15, 31, and 65535. (The value 1 is a special case; the samples are not actually sent and the decoder assumes their values to be 0.) The quantisation levels are equally spaced in the interval −1.0 to +1.0; the number of levels is always odd (so 0 will always be included as one level).

The scalefactors defined for MPEG Layer II encoding increment in 2 dB steps. In an encoder, the starting point for the choice of scalefactor is the scalefactor which is just greater than (or equal to) the largest sample in that scalefactor block. The standard specifies a decoder, so the encoder has a free choice of scalefactors (as long as they are not less than the starting point just specified). However, the standard does give an example encoder and a procedure for choosing scalefactors. When the encoder has determined 3 such scalefactors for the 3 scalefactor blocks of the frame, it may then increase some of the scalefactors so that consecutive scalefactors are the same. This is more efficient in terms of the number of bits which are used to encode the scalefactors. According to the stated procedure, having determined the minimum possible scalefactors for the 3 scalefactor blocks, the first may be increased by up to 4 steps, the second by up to 2 steps, and the third up to the larger of the first and second scalefactors, in order to make consecutive scalefactors equal.

An alternative, more efficient way of determining possible scale factors is as follows: In each scalefactor block, find the smallest scalefactor greater than or equal to the largest sample in the block. If this scalefactor has the index $S_0$, try also $S_0-1$ and $S_0-2$. It is not necessary to try $S_0-3$ because this is 6 dB higher than $S_0$ and the step size will be exactly twice that obtained using $S_0$. In other words, the quantisation levels obtained using $S_0-3$ are a subset of the levels obtained using $S_0$. A quantisation noise result obtained using $S_0-3$ will be either the same as the result using $S_0$, or worse.

When the optimum bit-allocation and scalefactors for the three parts of the frame have been selected, tests can be made to see if consecutive scalefactors can be made equal by adjusting one or two of the scalefactor indices down by three steps (i.e. increasing a scalefactor by 6 db). If this is possible, the quantisation noise should be recalculated for the new case. If the noise remains (very nearly) the same as it was before, then the adjustment should be made.

When this method is used, it is not appropriate or necessary to bias the noise results in favour of efficient scalefactor combinations.

Figure 2:
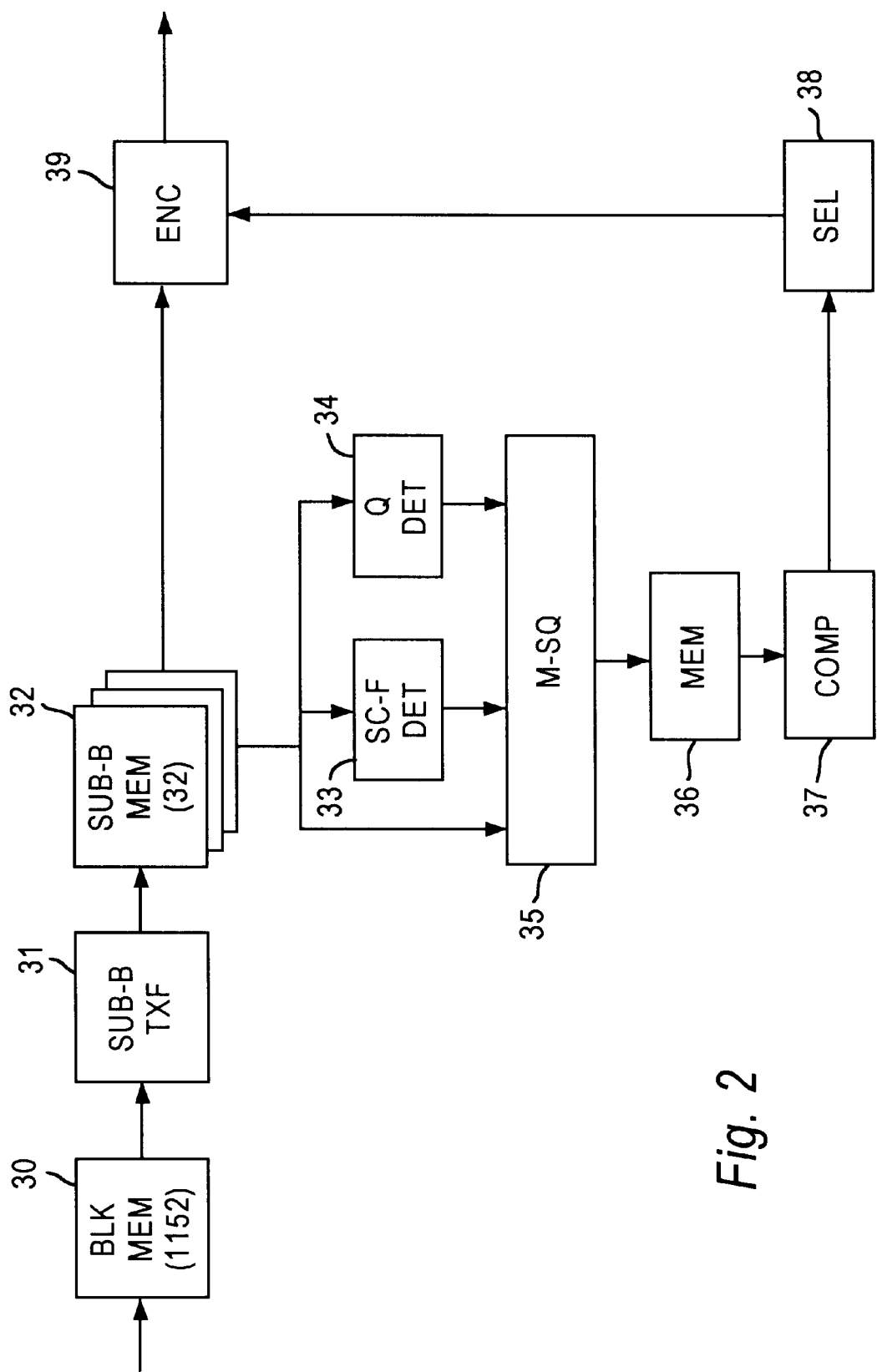
FIG. 2 is a block diagram of apparatus for performing MPEG Layer II Audio Coding.

FIG. 2 shows apparatus for determining the coding parameters of a pcm signal derived from an MPEG Layer II Audio Coding. The incoming signal is fed to a memory 30 which stores a block of 1152 pcm audio samples. These are fed to a conversion unit 31 which transforms them into the sub-band domain. The transformed signal are stored in a set of 36 sub-band memories, each of which stores a set of 32 sample values.

For each sub-band in turn, the signals are fed to a scalefactor determining unit 33 which determines what are the possible or likely scalefactors for the 3 scalefactor blocks of the sub-band.

The scalefactors may have been equalized as discussed above. The scalefactors are referred to by an index, a smaller index corresponding to a larger scalefactor. If the minimum scalefactors determined from the decoded audio have indices $S_0$, $S_1$ and $S_2$, then the inclusive ranges of scalefactors which should be tried are as follows for the scalefactor blocks:

First: $S_0-5$ to $S_0$
Second: $S_1-3$ to $S_1$
Third: $Min(S_0,S_1,S_2)-1$ to $S_2$ Also, the quantisation of the original encoding may have resulted in the maximum sample value in a scalefactor block being reduced enough to take it into a lower scalefactor range; the analysis therefore allows for at least one additional step of the scalefactor.

Next, the possible numbers of quantisation levels are determined, by a quantisation determining unit 34.

Next, in each of the three scalefactor blocks, the mean squared quantisation noise is evaluated by a computation unit 35 for the possible scalefactor and quantisation combinations, and the results stored in a memory 36.

Next, a further computation unit 37 uses these noise results to work out the rms noise for the whole frame for all possible combinations of number of quantisation steps and scalefactors for the 3 scalefactor blocks. This is done by summing the appropriate mean squared quantisation noise values for the 3 scalefactor blocks, dividing the result by 3, and then taking the square root. The unit 37 also biases these rms noise results in favour of scalefactor combinations which use fewer numbers of bits, by, for example, multiplying by 1.02, 1.01 or 1.00 as the number of bits used for the scalefactors is 18, 12, or 6 respectively. For each result, the unit 37 then calculates a confidence factor as the number of steps divided by the biassed noise.

The results determined by the unit 37 are fed to a selector 38, which chooses the result, and hence the combination of scalefactors and bit allocation, with the highest confidence factor.

Finally, the block stored in the block memory 30 has each of its sub-bands coded by an encoding unit 39, which implements MPEG Layer II Audio Coding. The encoding unit will need to check that the total number of bits required to encode the frame is within the limit of the bit-rate in use. It may occasionally happen that the wrong choice of parameters is made in a sub-band (e.g. too high a bit-allocation is chosen). It can then occur that more bits are required to encode the frame than are available. In this case the encoder must modify the bit allocation in one or more sub-bands to meet the bit limit.

One simple way of doing this is to estimate the signal-to-noise ratio in each sub-band using the quantiser step size as an estimate of the noise level. the bit-allocation in the sub-band with the highest signal-to-noise level is decremented. This process is repeated until the bit limit is me. A refinement of this method is to use mask-to-noise ratio instead of signal-to-noise ratio; the masking level being estimated from a psychoacoustic model.

For each sub-band, the coding parameters are those chosen by the selector 38 for that sub-band. The encoding unit 39 carries out the final stages of encoding, which may be regarded as commencing with the division of the input signal into a block by block memory 30, the transforming of the block into sub-bands by conversion unit 31, and the storage of the 36 sub-bands (each of 32 samples) by the sub-band memories 32.

Application to MPEG-coded Video

In video coded according to MPEG-1 or MPEG-2, three type of coded video picture are found: I, P and B. An I (intra-coded) picture is coded without reference to other pictures in the sequence. When analysing decoded video to determine previous coding parameters, the parameters of intra-coded pictures are most easily determined.

A sampled video picture is partitioned into 16×16 pixel macroblocks. The macroblock is divided into four 8×8 blocks of luminance samples, one 8×8 chrominance Cb block and one 8×8 chrominance Cr block. These six 8×8 blocks are each transformed by a DCT. In intra-coded pictures, the resulting coefficients are then quantised.

In MPEG-1 and MPEG-2 4:2:0 profile, the same quantisation is applied to luminance and chrominance coefficients. For non-dc (not c[0,0] coefficient), the quantisation is as follows:

$$i[u,v]=8*c[u,v]//(q*m[u,v])$$

where:

// represents division with rounding to nearest integer;

u,v represent the position in the 8×8 block, range 0–7;

q is quantiser scale, range 1–31;

m[u,v] is an element of the intra quantisation matrix, range 1–255;

c[u,v] is a DCT coefficient, range −2048 to +2047;

i[u,v] is the quantised DCT coefficient, and q and m[u,v] will be such that i[u,v] lies in the range −255 to +255.

The value of q, the quantiser scale can change every macroblock but will often remain constant for a number of consecutive macroblocks.

The intra quantisation matrix, m, can change every picture but will usually be constant for a (large) number of consecutive pictures. In addition, there is a default quantisation matrix. The values of this matrix are more likely to be used than non-default values.

Analysis of a decoded video signal, to identify the quantisation used for I pictures can proceed as follows:

1. Divide input picture into macroblocks
2. Divide macroblocks into blocks
3. Apply DCT transform to blocks
4. For each DCT coefficient position, there are six values from the six blocks of the macroblock, which will all have had the same quantisation step size. For these six values:
4a. Try quantising with various possible values of (q * m[u, v]) and calculate the mean square difference between the values before and after the trial quantisation.
4b. Choose the coarsest quantiser (largest (q * m[u, v])) for which this mean square difference is below a set threshold. NB. If the coefficients prior to trial quantisation are below this threshold, this indicates that they were quantised zero and there is no need to search for a quantiser.
5. Repeat for the other coefficient positions.
6. Find the highest common factor of the (q * m[u, v]) values determined in step 4b. This is an estimate of q, the quantisation scale code used in the original encoding. The corresponding m[u, v] values are an estimate of the intra quantisation matrix.

When all the macroblocks in a picture are analysed, a consistent quantisation matrix should be found. If it is not, this is an indication that the source picture was not previously coded or was not coded as an I picture.

In a more sophisticated algorithm, a number of possible (q*m[u,v]) values are produced in in step 4b, preferably ordered or associated with an indication of the likelihood of the values being correct. This increases the likelihood of finding a quantisation matrix compatible with all macroblocks in the picture.

In a further enhancement, it is possible to use statistical properties of MPEG coded video and default assumptions to arrive at the most likely quantisation parameters. These include:

Values from the default intra quantisation matrix are most likely.

The intra-quantisation matrix is not likely to change very often and will probably be the same for an entire programme.

The quantisation scale is most likely to change at the start of a horizontal stripe of a picture.

Thus, by applying the above rules, for example initially setting intra-quantisation matrix values to default and only departing from these if there is clear disagreement, rather than attempting to calculate the values de novo each time, and by setting a lower requirement for changing the quantisation scale at the start of a horizontal stripe, there is a greater likelihood that the correct values will be determined more rapidly.

MPEG audio and video applications have been specifically described above, but the invention is, as will be apparent, applicable to re-coding of any previously coded (particularly compressed or quantised) data.

Thus, in summary, the invention may be applied in a variety of ways to provide more seamless cascaded de-coding and re-coding of a variety of types of data signals. By analysing the input signal to determine the characteristics of a previous coding, the need for a separate information channel carrying details of coding characteristics, or the amount of information to be carried can be reduced; all the above embodiments of the invention can, if desired, be employed in conjunction with means for receiving an information carrying signal, and the provision of both may enable analysis to be simplified without requiring an unduly large amount of coding information to be carried. The information carrying signal may contain information describing at least some of the previous coding characteristics, or may at its simplest be provided to assist in framing or identification of blocks within the coded signal.

Each feature disclosed herein may be independently provided unless otherwise stated. The appended abstract is incorporated herein by reference.

What is claimed is:

1. Encoding apparatus for encoding an input signal, comprising:
   encoding means for performing a selected one of a plurality of different possible encodings;
   analysing means for analysing the input signal to detect characteristics of a previous coding, wherein the analysing means determines the difference between the input signal and the result of a plurality of trial encodings thereof matching the encodings which the encoding means can perform and
   selection means for selecting the type of encoding to be performed according to the results of the analysis.

2. Encoding apparatus according to claim 1 wherein the encoding means comprises a plurality of encoders.

3. Apparatus according to claim 1 wherein the encoding means comprises at least one encoder the operation of which is controlled by one or more operating parameters supplied by the selection means.

4. Apparatus according to claim 3 wherein the parameters include the number of quantisation levels.

5. Apparatus according to claim 3 wherein the parameters include the sampling frequency.

6. Apparatus according to claim 3 wherein the parameters include scalefactors.

7. Apparatus according to claim 1 wherein the analysing means is fed from the output of the encoding means.

8. Apparatus according to claim 1 wherein the analysing means is fed from an intermediate point of the encoding means.

9. Apparatus according to claim 1 wherein the analysing means determines the differences sequentially.

10. Apparatus according to claim 1 in which the encoding means comprises a block encoder.

11. Apparatus according to claim 10 wherein the analysing means is adapted to analysis different block alignments until the correct one is found.

12. Apparatus according to claim 1 wherein the analysing means is adapted to determine whether or not the input signal has previously been coded.

13. Apparatus according to claim 1 adapted and arranged to re-encode previously compressed audio.

14. Apparatus according to claim 13, wherein the previously compressed audio is MPEG audio.

15. Apparatus according to claim 1 adapted and arranged to re-encode previously compressed video.

16. Apparatus according to claim 15, arranged to determine previous encoding characteristics from a previously encoded intra-coded (I) frame.

17. Apparatus according to claim 15 including means for generating at least one estimate of a product of a quantiser scale and an intra-quantisation matrix.

18. Apparatus according to claim 17 including means for estimating a value for said quantiser scale based on the highest common factor of quantiser scale and intra-quantisation matrix values determined for a plurality of blocks.

19. Apparatus according to claim 15, wherein the previously compressed video is MPEG video.

20. Apparatus according to claim 1 arranged to determine encoding parameters based on stored criteria relating based on the nature of the signal and based on measured parameters of the signal.

21. Apparatus according to claim 1, including means for receiving information concerning characteristics of a previous encoding.

22. A method of encoding a signal comprising:
- analysing the signal to detect characteristics of a previous coding, wherein analysing comprises determining the difference between the signal and the result of a plurality of trial encodings thereof matching a plurality of encodings which can be performed;
- selecting the type of encoding to be performed according to the results of the analysis;
- encoding the signal according to one of said plurality of encodings based on said analysing and said selecting.

23. A method according to claim 22 for re-encoding a previously quantised signal comprising determining an estimate of the previous quantising parameters and encoding the signal using corresponding quantising parameters.

24. A method according to claim 22 further comprising receiving information concerning characteristics of said previous encoding, wherein the signal is encoded based on the results of the analysis and the received information.

25. Apparatus for re-encoding a previously coded signal comprising means for receiving a decoded previously coded signal, means for estimating parameters of a previous coding by determining the difference between the signal and the result of a plurality of trial encodings thereof which the apparatus can perform and means for coding the signal, wherein the means for coding the signal is arranged to code the signal based on the estimated parameters.

26. Apparatus according to claim 25, wherein the estimating means is arranged to re-estimate at least some of said parameters while coding is proceeeding.

* * * * *